(12) United States Patent
Watanabe

(10) Patent No.: US 7,728,257 B2
(45) Date of Patent: Jun. 1, 2010

(54) METHOD OF FORMING EMBRITTLED AREAS INSIDE WAFER FOR DIVISION

(75) Inventor: Yosuke Watanabe, Tokyo (JP)

(73) Assignee: Disco Corporation, Tokyo (JP)

( * ) Notice: Subject to any disclaimer, the term of this patent is extended or adjusted under 35 U.S.C. 154(b) by 412 days.

(21) Appl. No.: 11/878,449

(22) Filed: Jul. 24, 2007

(65) Prior Publication Data

US 2008/0023456 A1    Jan. 31, 2008

(30) Foreign Application Priority Data

Jul. 25, 2006    (JP)    .............................. 2006-202464

(51) Int. Cl.
*B23K 26/02*    (2006.01)
*H01L 21/00*    (2006.01)
(52) U.S. Cl. .................................. 219/121.82; 438/460
(58) Field of Classification Search . 219/121.6–121.86; 438/460–462
See application file for complete search history.

(56) References Cited

U.S. PATENT DOCUMENTS 6,992,026 B2 * 1/2006 Fukuyo et al. .............. 438/797
7,141,443 B2 * 11/2006 Nagai et al. .................. 438/33

FOREIGN PATENT DOCUMENTS

JP    2002-192370    7/2002

* cited by examiner

*Primary Examiner*—Sang Y Paik
(74) *Attorney, Agent, or Firm*—Wenderoth, Lind & Ponack L.L.P.

(57) ABSTRACT

A method of forming embrittled areas in multiple layers inside a wafer so as to enable the wafer to be divided correctly even at areas where embrittled areas intersect. In a first direction embrittling step an embrittled area is formed as a bottom layer, in a second direction embrittling step embrittled areas are formed as a bottom layer and a second layer, in the first direction embrittling step the embrittled areas are formed as a second layer and a third layer, and thereafter, the second direction embrittling step and the first direction embrittling step are alternately implemented, and finally, in the second direction embrittling step, embrittled area is formed as a top layer, so that a length of an unprocessed area is contained within a range that does not interfere with division.

1 Claim, 7 Drawing Sheets

METHOD OF FORMING EMBRITTLED AREAS INSIDE WAFER FOR DIVISION

BACKGROUND OF THE INVENTION

1. Field of the Invention

The present invention relates to a method of forming embrittled areas inside a wafer for dividing the wafer in which a plurality of devices is formed.

2. Descriptions of Related Art

Conventionally, a wafer in which a plurality of devices such as IC, LSI and the like is formed is divided into individual devices by a dividing apparatus such as a dicing apparatus, and the individual devices are then used in a variety of electronic devices, such as mobile phones, personal computers, and so forth.

As a technology for dividing the wafer into individual devices, a technology that directs a laser beam of a wavelength capable of penetrating the wafer onto focal points established inside the wafer and irradiating the wafer so as to form embrittled areas inside the wafer has been proposed (see, for example, JP-A-2002-192370).

However, a thickness in the depth direction of the embrittled areas formed inside the wafer that is obtained with a single laser beam irradiation is approximately 20 μm to 30 μm, and therefore in the case of a thick wafer, i.e., having a thickness of 200 μm-300 μm, (for example, for CCD or for MEMS), the embrittled areas must be formed in multiple layers. For example, after forming embrittled areas in multiple layers inside predetermined division lines in a first direction, embrittled areas are formed in multiple layers inside predetermined division lines in a second direction. However, a problem with this approach is that, formerly formed embrittled areas in the first direction form a wall that disperses the intersecting laser beam to be emitted subsequently in the second direction, as a result. Accordingly, in areas where the embrittled areas intersect, embrittled areas are not formed inside the predetermined division lines in the second direction, and thus the wafer cannot be divided correctly along the predetermined division lines.

SUMMARY OF THE INVENTION

Accordingly, the present invention is conceived in light of the above problems, and has as an object to provide a method of forming embrittled areas inside a wafer capable of forming embrittled areas in multiple layers so as to enable a wafer to be divided correctly even at areas where embrittled areas intersect.

To solve the above-described problem and achieve the above-described object, the method of forming embrittled areas inside a wafer for dividing the wafer that positions a focal point of a laser beam having a wavelength capable of penetrating the wafer having predetermined division lines of a first direction and predetermined division lines of a second direction that intersect the predetermined division lines of the first direction and irradiates insides of the predetermined division lines of the first direction and the predetermined division lines of the second direction, and moves the wafer and the laser beam relative to each other and forms embrittled areas in multiple layers inside the predetermined division lines of the first direction and the predetermined division lines of the second direction, the method comprises: a first direction embrittling step of forming embrittled areas inside the predetermined division lines of the first direction in multiple layers by stacking on a bottom layer one by one; and a second direction embrittling step of forming embrittled areas inside the predetermined division lines of the second direction in multiple layers by stacking on a bottom layer one by one; wherein the first direction embrittling step and the second direction embrittling step being alternately executed so that length of each unprocessed area formed where layers of embrittled areas in the first and second direction crossing each other are made minimum being kept within a range that does not interfere with division of the wafer.

In addition, provided that the wafer thickness is T μm, a thickness of each embrittled area formed by irradiation by the laser beam is h μm, number of consecutive execution times of the first and second direction embrittling steps is "n", and $T \geq 2h$, the method is preferably carried out by executing the first direction embrittling step under n=1 to form embrittled areas as a bottom layer; executing the second direction embrittling step under n=2 to form embrittled areas as a bottom layer and a second layer stacked on the bottom layer, executing the first direction embrittling step under n=2 to form embrittled areas as a second layer stacked on the bottom layer and as a third layer stacked on the second layer, thereafter, executing the first direction embrittling step and the second direction embrittling step under n=2 alternately; and finally, executing the second direction embrittling step under n=1 to form embrittled areas as a top layer.

Further, the first direction embrittling step and the second direction embrittling step may be executed alternately each other per layer.

According to the method according to the present invention, the first direction embrittling step and the second direction embrittling step are alternately executed so that length of each unprocessed area formed where layers of embrittled areas in the first and second direction crossing each other are made minimum being kept within a range that does not interfere with division of the wafer. Therefore, such unprocessed areas of lengths that interfere with division are not formed where the embrittled areas intersect and the wafer can be divided correctly along the predetermined division lines in accordance with the formed multiple layers of embrittled areas.

In addition, by switching the order of precedence of the first direction embrittling step and the second direction embrittling step and executing them alternately, such as executing the first direction embrittling step to form embrittled areas as a bottom layer, executing the second direction embrittling step to form embrittled areas as a bottom layer and a second layer stacked on the bottom layer; and executing the first direction embrittling step to form embrittled areas as a second layer stacked on the bottom layer and as a third layer stacked on the second layer; the unprocessed areas that remain at where the embrittled areas intersect can be disbursed within the predetermined division lines of the first direction and within the predetermined division lines of the second direction, thus equalizing the ease with which the wafer is divided along both sets of predetermined division lines, and at the same time reducing the number of times the embrittlement direction is switched, thereby enabling throughput to be improved.

Other objects, features and advantages of the present invention will be apparent from the following description when taken in conjunction with the accompanying drawings, in which like reference characters designate the same or similar parts throughout the figures thereof.

DETAILED DESCRIPTION OF THE PREFERRED EMBODIMENTS

A detailed description will now be given of a preferred embodiment of the present invention, with reference to the accompanying drawings.

Figure 1:
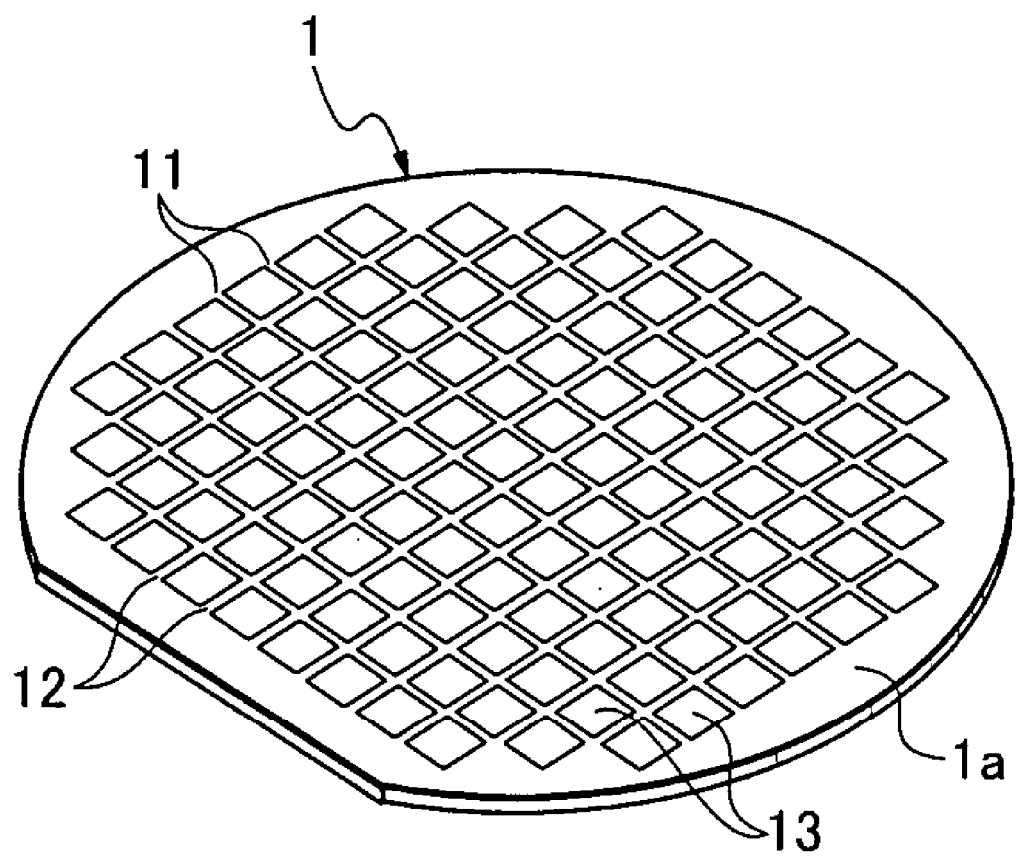
FIG. 1 is a perspective view of one example of a wafer construction to which a method of forming embrittled areas inside a wafer for dividing the wafer of the present embodiment is applied.

FIG. 1 is a perspective view of one example of a wafer construction to which a method of forming embrittled areas inside a wafer for dividing the wafer of the present embodiment is applied. The wafer 1 may be formed in the shape of a disc, with a silicon substrate, for example, as its base, and has predetermined division lines 11 of a first direction and predetermined division lines 12 of a second direction that intersect the predetermined division lines 11 of the first direction at right angles. A plurality of devices 13, such as CCD, is provided in a front surface 1a of the wafer 1, at each of areas demarcated into rectangular shapes by the predetermined division lines 11, 12.

With such a wafer 1, a laser beam of a wavelength capable of penetrating the wafer 1 is directed onto focal points established inside the predetermined division lines 11, 12 of the wafer 1 and the wafer 1 is irradiated so as to form embrittled areas inside the wafer 1, and the wafer 1 is divided into the individual devices 13 by dividing along the predetermined division lines 11, 12.

Figure 2:
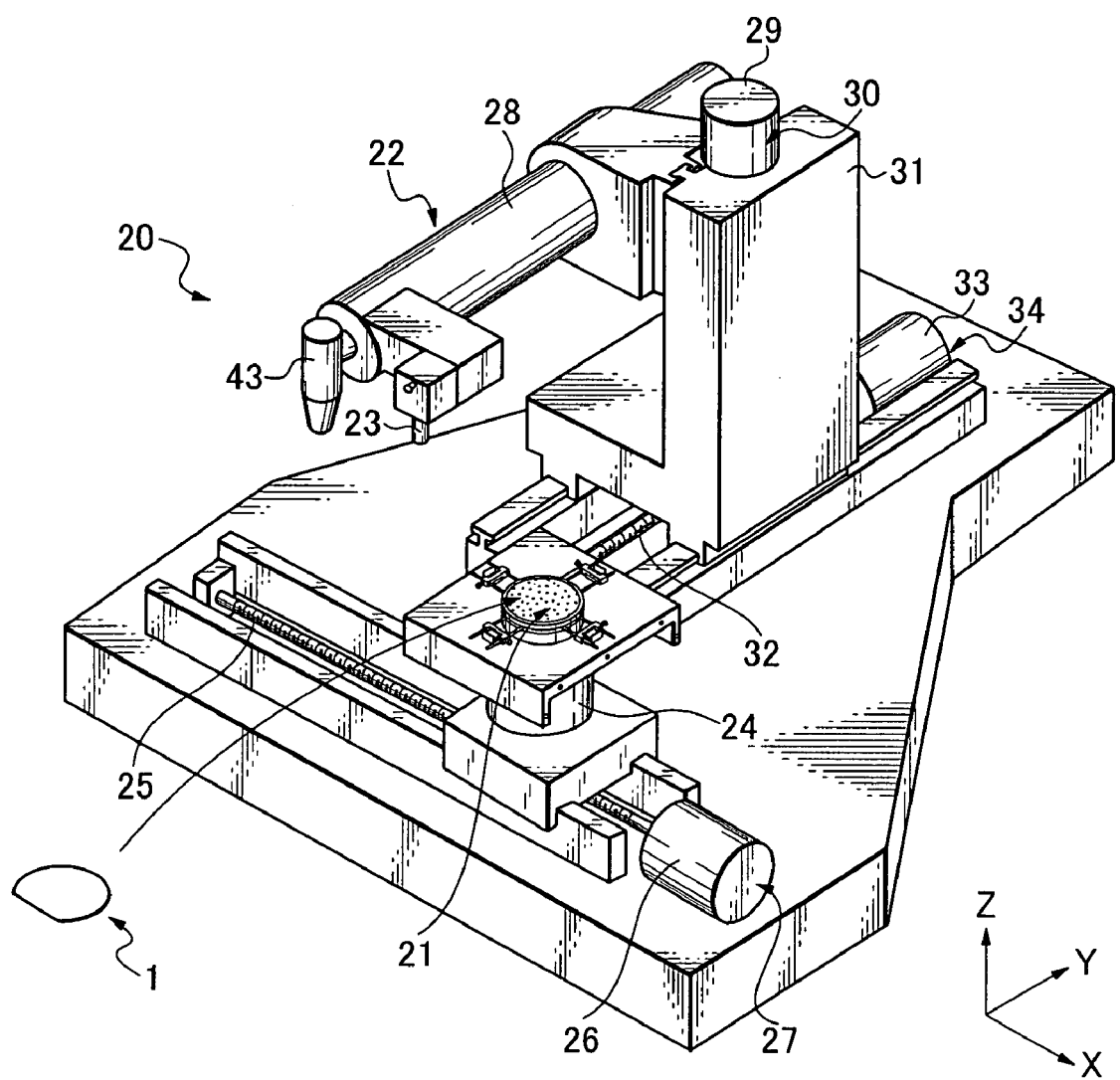
FIG. 2 is a perspective view of the structure of a portion of a laser apparatus.
Figure 3:
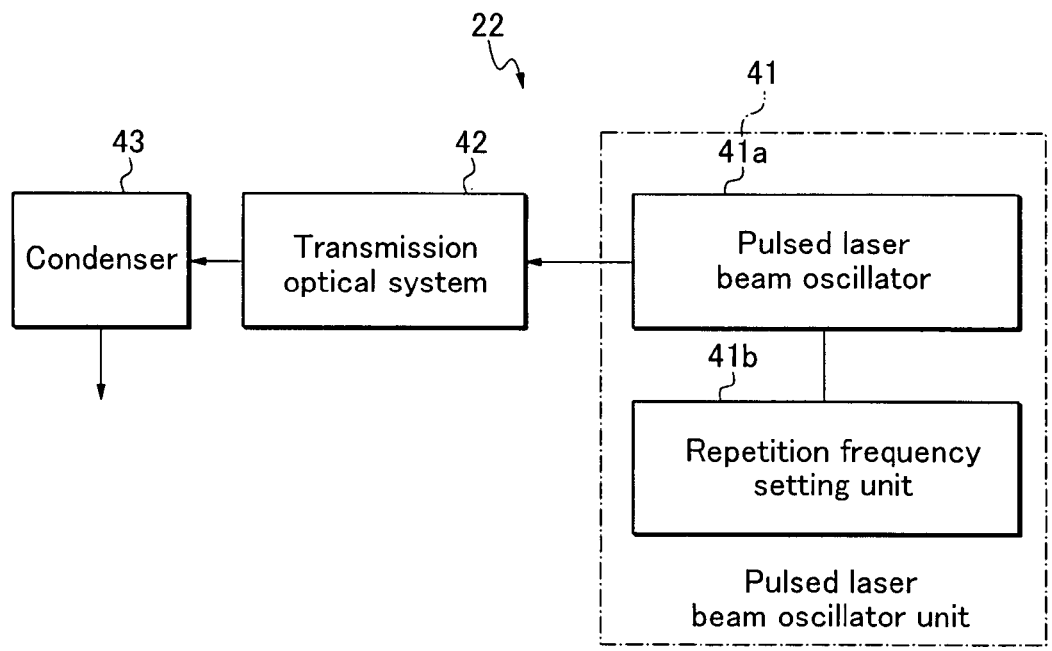
FIG. 3 is a block diagram of one example of a configuration of a laser beam irradiation unit.
Figure 4:
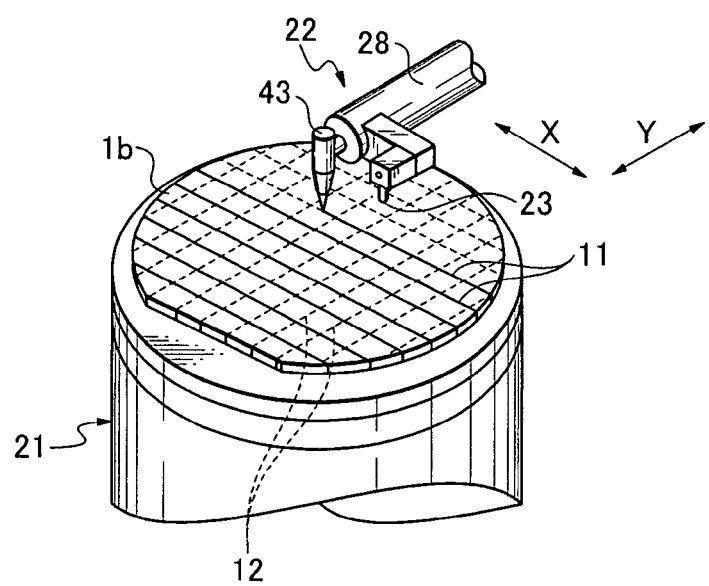
FIG. 4 is a perspective view of an area around a chuck table for the purpose of illustrating an embrittling step.

In order to form the embrittled areas for division inside the wafer 1, a laser apparatus like that shown in FIGS. 2 to 4 is used. FIG. 2 is a perspective view of the structure of a portion of the laser apparatus, and FIG. 3 is a block diagram of one example of the configuration of a laser beam irradiation unit. A laser apparatus 20 used in the present embodiment is comprised of a chuck table 21 that holds the wafer 1, a laser beam irradiation unit 22 that emits a pulsed laser beam of a wavelength capable of penetrating the wafer 1 held on the chuck table 21, and an image sensing unit 23 that images the wafer 1 held on the chuck table 21. The chuck table 21 suctionally holds the wafer 1, and at the same time is rotatably coupled to a motor 24. The chuck table 21 is movable in a horizontal X-axis direction by a feed unit 27 comprised of a ball screw 25, a nut, not shown, a pulse motor 26, and so forth, such that a mounted wafer 1 is moved relative to the pulsed laser beam that the laser beam irradiation unit 22 emits.

In addition, the laser beam irradiation unit 22 contains a substantially horizontally disposed cylindrical casing 28, and is movable in a Z-axis direction through the casing 28 by a Z-axis movement unit 30 comprised of a ball screw, not shown, a nut, not shown, a pulse motor 29, and so forth. Further, the laser beam irradiation unit 22 is movable in a Y-axis direction, which is the horizontal direction, by indexing feed unit 34 comprised of the casing 28, a pedestal 31 mounting the Z-axis movement unit 30, a ball screw 32, a nut, not shown, a pulse motor 33, and so forth, which feeds the laser beam irradiation unit 22 relative to the wafer 1 on the chuck table 21 to indexed points sequentially.

Inside the casing 28, as shown in FIG. 3, are disposed a pulsed laser beam oscillation unit 41 and a transmission optical system 42. The pulsed laser beam oscillation unit 41 is composed of a pulsed laser beam oscillator 41a such as a Q-switched Nd:YAG laser pumped by LD and a repetition frequency setting unit 41b installed on the pulsed laser beam oscillator 41a. In addition to such optical elements as a beam splitter and the like, the transmission optical system 42 also includes an output adjustment means such as an attenuator or the like. In addition, a condenser 43 containing a condenser lens, not shown, composed of a well-known structure such as an objective lens is installed on a front end of the casing 28.

In addition, the image sensing unit 23 installed on the front end of the casing 28 images a top surface of the wafer 1 held on the chuck table 21 and detects an area to be processed by the pulsed laser beam emitted from the condenser 43 of the laser beam irradiation unit 22, is equipped with an image sensing element (CCD), and transmits sensed image signals to a control unit, not shown.

Figure 5A:
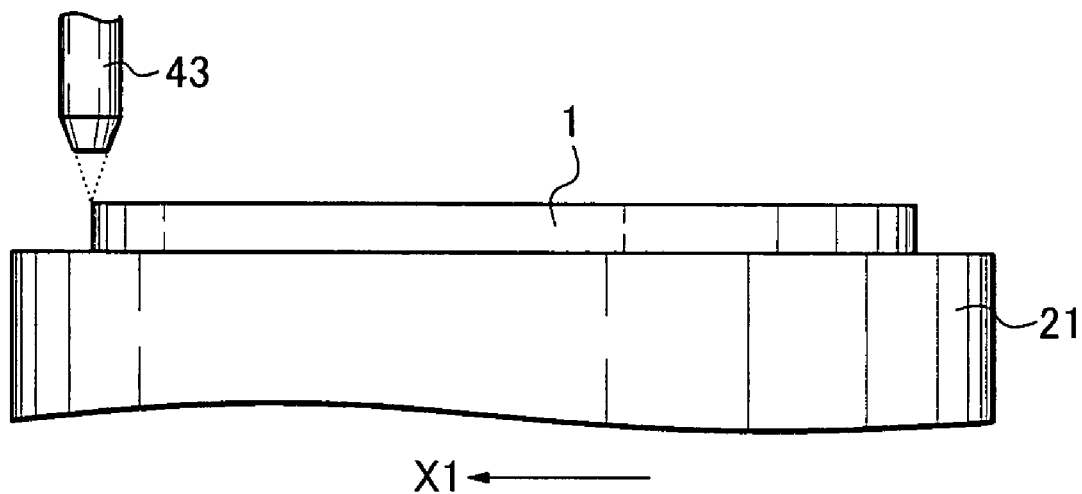
FIG. 5A illustrates a start of a laser beam irradiation step and FIG. 5B illustrates an end of the laser beam irradiating step.
Figure 5B:
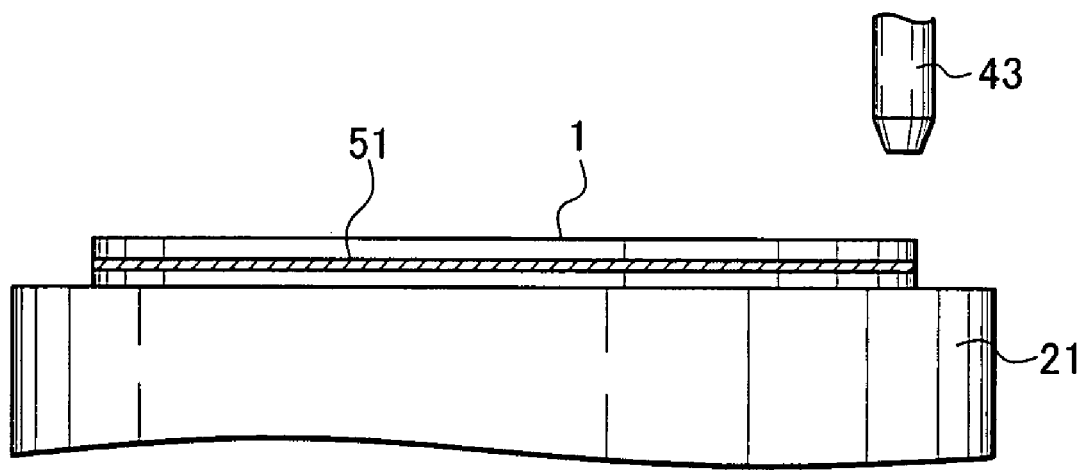
Figure 6:
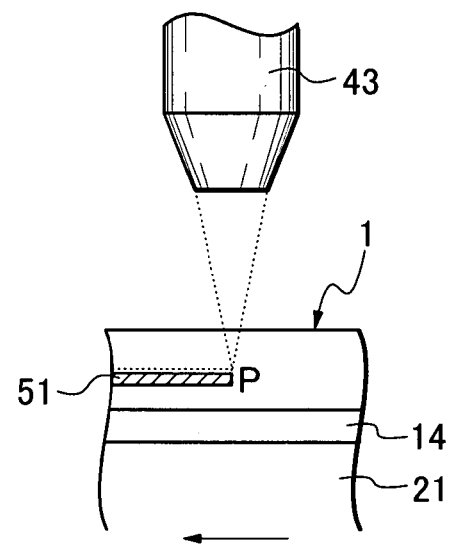
FIG. 6 shows an enlarged view of a state of formation of an embrittled area.

A description is now given of the embrittlement process that uses the laser apparatus 20 described above, with reference to FIG. 2 as well as to FIGS. 4 to 6. First, as shown in FIG. 4, the wafer 1 is placed on the chuck table 21 with a rear surface 1b side facing up and the wafer 1 is suctionally held on top of the chuck table 21. It should be noted that, preferably, protective tape is affixed in advance to the front surface 1a of the wafer 1 that contacts the chuck table 21. The chuck table 21 suctionally holding the wafer 1 is then positioned beneath the image sensing unit 23 by the feed unit 27 and the indexing feed unit 34.

Once the chuck table 21 is positioned beneath the image sensing unit 23, the image sensing unit 23 and the control unit, not shown, execute an alignment task to detect the areas to execute laser processing on the wafer 1. Specifically, the image sensing unit 23 and the control unit execute image processing such as pattern matching or the like in order to align the predetermined division lines 11 formed in the first direction on the wafer and the condenser 43 of the laser beam irradiation unit 22 that emits a pulsed laser beam along the predetermined division lines 11. At this time, laser beam irradiation position alignment is also carried out on the predetermined division lines 12 in the second direction that intersect the predetermined division lines 11 in the first direction formed in the wafer 1.

Once the laser beam irradiation position alignment is carried out, as shown in FIG. 5A the chuck table 21 is moved to a laser beam irradiation area at which the condenser 43 that emits the pulsed laser beam is positioned and one end of the predetermined division line 11 of the first direction (in FIG. 5A, the left end) is positioned directly beneath the condenser 43. Then, the chuck table 21, that is, the wafer 1, is moved at a predetermined processing feed speed in a direction indicated by an arrow X1 in FIG. 5A while the condenser 43 emits a pulsed laser beam of a wavelength capable of penetrating the wafer 1. Then, as shown in FIG. 5B, when the irradiation position of the condenser 43 reaches the other end of the predetermined division line 11, emission of the pulsed laser beam by the laser beam irradiation unit 22 is stopped and at the same time the movement of the chuck table 21, that is the wafer 1, is stopped. In such an embrittling step, as shown in FIG. 6, by positioning a focal point P of the pulsed laser beam inside the area of the wafer 1 on the predetermined division line 11 and irradiating the focal point P with the impulsed laser beam, an embrittled area 51 is formed. After forming embrittled areas 51 inside all of the predetermined division lines 11 of the first direction, the wafer 1 is rotated 90° by rotating the chuck table 21 90° and embrittled areas 51 are similarly formed inside all the predetermined division lines 12 of the second direction by irradiation with the pulsed laser beam. By applying an external force on the wafer 1 along the predetermined division lines 11, 12 which have been weakened by continuously forming embrittled areas 51 in the manner described, the wafer divides along the predetermined division lines 11, 12 and can be separated into the individual devices 13.

An example of embrittlement conditions in this case is given below.

| | |
|---|---|
| Wavelength | 1064 nm (using Q-switched Nd:YAG laser pumped by LD) |
| Pulse output | 2.5 µJ |
| Beam spot diameter | 1.0 µm |
| Pulse duration | 40 ns |
| Repetition frequency | 100 kHz |
| Processing feed speed | 100 mm/s |

If the thickness of the wafer 1 is T µm, then in order to form the embrittled areas 51 and divide the wafer 1 correctly it is necessary to form the embrittled areas 51 to 60% to 70% or more of the thickness T. By contrast, under the embrittlement conditions described above, for example, the thickness of the embrittled area 51 formed by a single laser beam irradiation is approximately h=20 µm to 30 µm. Consequently, for a thick wafer 1 having a thickness T of from 200 µm to 300 µm, when forming embrittled areas 51 for division of a wafer for which T≧2h, the embrittled areas 51 inside the predetermined division lines 11, 12 must be formed in multiple layers.

Figure 7:
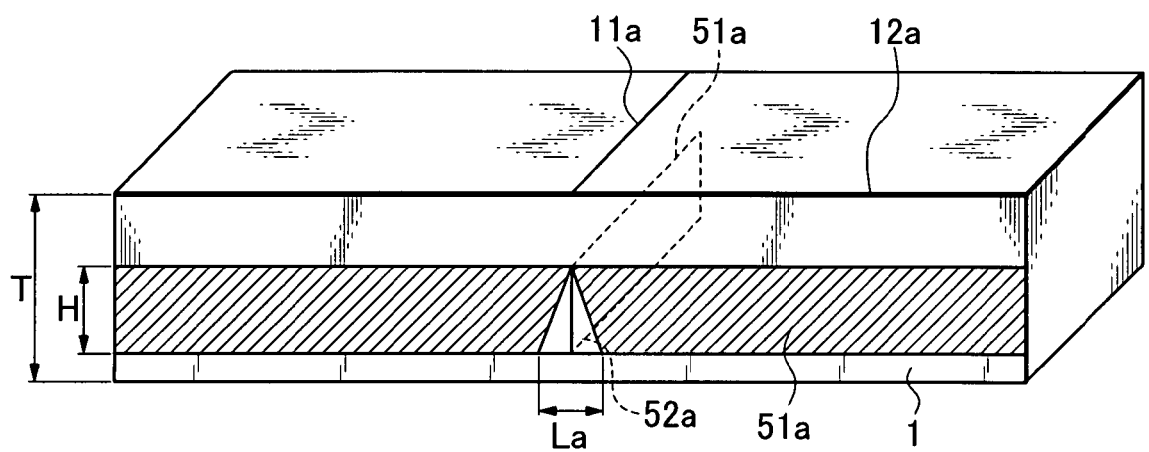
FIG. 7 illustrates conventional method of forming embrittled areas.

In this case, for example, as shown in FIG. 7, when after forming an embrittled area 51a in multiple layers inside a predetermined division line 11a of the first direction an embrittled area 11a is formed in multiple layers inside a predetermined division line 12a of the second direction, at an area where the embrittled areas 51a intersect the embrittled area 51a of the predetermined division line 11a side produced first forms a wall that disperses the laser beam emitted for the purpose of forming the embrittled area 51a of the predetermined division line 12a. As the result, an unprocessed area 52a is formed in the area that cuts across the embrittled area 51a of the predetermined division line 11a that is formed first. This unprocessed area 52a widens into a triangular shape with respect to the laser beam irradiation from above, and therefore a length La of the unprocessed area 52a at a bottom side portion of the embrittled area 51a is substantially identical to a thickness H of the embrittled area 51 of the predetermined division line 11a formed first. Here, as the thickness H of the embrittled area 51a formed in multiple layers increases, the length La of the unprocessed area 52a increases and becomes such a length that it begins to interfere with division, the wafer 1 becomes difficult to crack, and it becomes impossible to divide the wafer 1 correctly.

Accordingly, the present embodiment, under conditions in which T≧2 h, in forming the embrittled areas 51 in multiple layers inside the predetermined division lines 11 of the first direction and inside the predetermined division lines 12 of the second direction, provides a method of forming the embrittled areas 51 in multiple layers so that the length of the unprocessed area formed where the embrittled areas 51 intersect is kept within a range that does not interfere with the division of the wafer 1.

For that purpose, the method of forming embrittled areas inside a wafer of the present embodiment has been attained by focusing on the relation between the thickness of the embrittled area 51 formed by the laser beam irradiation and the length of the unprocessed area remaining at where the embrittled areas 51 intersect, in which when the focal point P of the laser light beam is positioned inside the streets 12 of the second direction and the embrittled areas 51 are formed after positioning the focal point P of the laser light beam inside the streets 11 of the first direction and forming the embrittled areas 51, unprocessed areas of lengths substantially identical to the thicknesses of the embrittled areas 51 in the streets 11 of the first direction are formed at where the streets 12 of the second direction cut across the embrittled areas 51 in the streets 11 of the first direction. That is, the method is comprised of a first direction embrittling step of forming embrittled areas 51 inside the predetermined division lines 11 of the first direction in multiple layers having thicknesses n·h (where "n" is number of layers of embrittled areas 51 to be formed by consecutive execution of the first direction embrittling steps) by stacking on a bottom layer one by one, and a second direction embrittling step of forming embrittled areas 51 inside the predetermined division lines 12 of the second direction in multiple layers having thicknesses n·h (where "n" is number of layers of embrittled areas 51 to be formed by consecutive execution of the second direction embrittling steps) by stacking on a bottom layer one by one.

Figure 8:
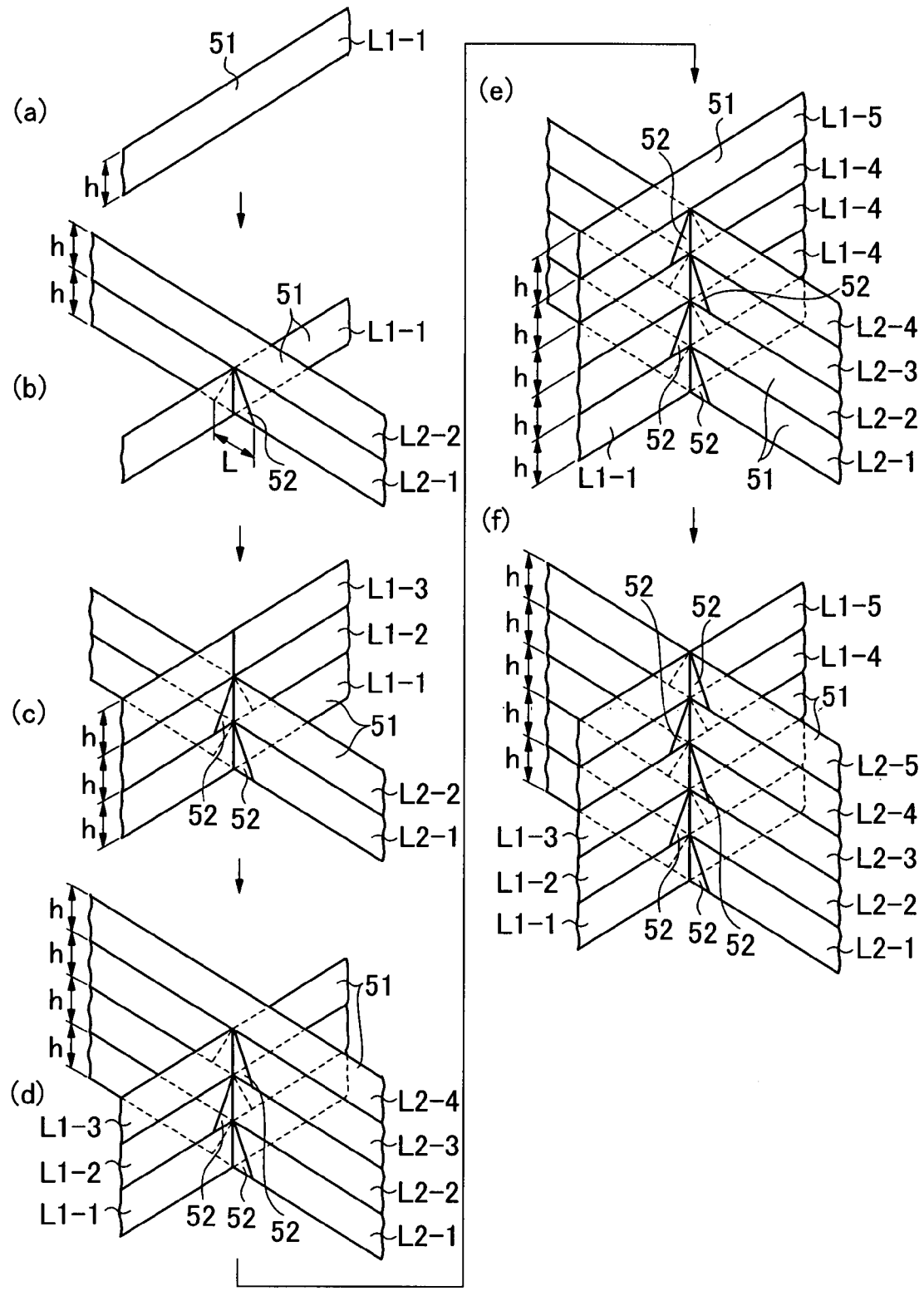
FIG. 8 is a schematic illustration of an order of formation of embrittled areas, extracting only an embrittled area at an intersection where embrittled areas intersect.

A detailed description is now given of one example of the method of forming embrittled areas inside a wafer of the present embodiment, with reference to FIG. 8. FIG. 8 is a schematic illustration of an order of formation of embrittled areas, extracting only an embrittled area at an intersection where embrittled areas intersect. Here, the number of layers of embrittled areas 51 formed inside the predetermined division lines 11, 12 is, for example, five. First, as shown in FIG. 8(a), in the first direction embrittling step, the focal point P of the pulsed laser beam to be emitted n=1 is positioned at a bottom layer of the predetermined division lines 11 of the first direction and an embrittled area 51 of the first direction is formed as a first layer L1-1. The thickness of the embrittled area 51 of the first layer L1-1 thus formed is "h".

Next, after the wafer 1 is rotated 90° by rotating the chuck table 21, as shown in FIG. 8(b), in the second direction embrittling step, with n=2, first, the focal point P of the pulsed laser beam to be emitted is positioned at a bottom layer of the predetermined division line 12 of the second direction and an embrittled area 51 of the second direction is formed as a first layer L2-1, after which the focal point P of the pulsed laser beam to be emitted is positioned at a second layer L2-2 of the predetermined division line 12 of the second direction and an embrittled area 51 of the second direction is formed as a second layer L2-2 stacked on top of the first layer L2-1. The thicknesses of the embrittled areas 51 of the first layer L2-1 and the second layer L2-2 thus formed are each "h". At this point, the embrittled area 51 of the first layer L2-1 is formed so as to intersect the embrittled area 51 of the first direction formed in the preceding first direction embrittling step, and therefore an unprocessed area 52 of a length L that is substantially identical to the thickness of the embrittled area 51 is formed in the shape of a triangle where the embrittled area 51 of the first layer L2-1 cuts across the embrittled area 51 of the first direction. However, because in the preceding first direction embrittling step the embrittled area 51 of the first layer L1-1 of thickness "h" is formed in advance, the length L of the unprocessed area 52 is approximately the same as the thickness "h" and is kept within a range that does not interfere with division. Moreover, the embrittled area 51 of the second layer L2-2 of the second direction is formed as a preceding area that does not contain an unprocessed area 52, without intersecting the area 51 of the first direction.

Next, after rotating the wafer 1 90° by rotating the chuck table 21, as shown in FIG. 8(c), in the first direction embrittling step, with n=2, first, with the focal point P of the pulsed laser beam to be emitted remaining positioned at a second layer L1-2 of the predetermined division lines 11 of the first direction an embrittled area 51 of the first direction is formed as the second layer L1-2 stacked on top of the first layer L1-1. And then, the focal point P of the pulsed laser beam to be emitted is positioned at a third layer L1-3 of the predetermined division line 11 of the first direction and an embrittled area 51 of the first direction is formed as the third layer L1-3 stacked on top of the second layer L1-2. The thicknesses of the embrittled areas 51 of the second layer L1-2 and the third layer L1-3 thus formed are each "h". At this point, the embrittled area 51 of the second layer L1-2 is formed so as to intersect the embrittled area 51 of the second direction formed in the preceding second direction embrittling step, and therefore an unprocessed area 52 of length L that is substantially identical to the thickness of the embrittled area 51 is formed in the shape of a triangle where the embrittled area 51 of the second layer L1-2 cuts across the embrittled area 51 of the second direction. However, because in the preceding second direction embrittling step the embrittled area 51 of the second layer L2-2 of one layer's thickness "h" is formed in advance, the length L of the unprocessed area 52 is approximately the same as the thickness "h" and is kept within a range that does not interfere with division. Moreover, the embrittled area 51 of the third layer L1-3 of the first direction is formed as a preceding embrittled area that does not contain an unprocessed area 52, without intersecting the area 51 of the second direction.

Thereafter, with n=2 the second direction embrittling step and the first direction embrittling step are alternately executed. For example, after rotating the wafer 1 90° by rotating the chuck table 21, as shown in FIG. 8(d), in the second direction embrittling step, with n=2, first, with the focal point P of the pulsed laser beam to be emitted positioned at the third layer L2-2 of the predetermined division line 12 of the second direction an embrittled area 51 of the second direction is formed as the third layer L2-3 stacked on top of the second layer L2-2. And then, the focal point P of the pulsed laser beam to be emitted is positioned at a fourth layer L2-4 of the predetermined division line 12 of the second direction and an embrittled area 51 of the second direction is formed as the fourth layer L2-4 stacked on top of the third layer L2-3. The thicknesses of the embrittled areas 51 of the third layer L2-3 and the fourth layer L2-4 thus formed are each "h". At this point, the embrittled area 51 of the third layer L2-3 is formed so as to intersect the embrittled area 51 of the first direction formed in the preceding first direction embrittling step, and therefore an unprocessed area 52 of length L substantially identical to the thickness of the embrittled area 51 is formed in the shape of a triangle where the embrittled area 51 of the third layer L2-3 cuts across the embrittled area 51 of the first direction. However, in the preceding first direction embrittling step the embrittled area 51 of the third layer L1-3 of one layer's thickness "h" is formed in advance, and therefore the length L of the unprocessed area 52 is approximately the same as the thickness "h" and is kept within a range that does not interfere with division. Moreover, the embrittled area 51 of the fourth layer L2-4 of the second direction is formed as a preceding embrittled area that does not contain an unprocessed area 52, without intersecting the area 51 of the first direction.

Next, after rotating the wafer 1 90° by rotating the chuck table 21, as shown in FIG. 8(e), in the first direction embrittling step, with n=2, first, with the focal point P of the pulsed laser beam to be emitted remaining positioned at a fourth layer L1-4 of the predetermined division line 11 of the first direction an embrittled area 51 of the first direction is formed as the fourth layer L1-4 stacked on top of the third layer L1-3. And then, the focal point P of the pulsed laser beam to be emitted is positioned at a fifth layer L1-5 of the predetermined division line 11 of the first direction and an embrittled area 51 of the first direction is formed as the fifth layer L1-5 stacked on top of the fourth layer L1-4. The thicknesses of the embrittled areas 51 of the fourth layer L1-4 and the fifth layer L1-5 thus formed are each "h". At this point, the embrittled area 51 of the fourth layer L1-4 is formed so as to intersect the embrittled area 51 of the second direction formed in the preceding second direction embrittling step, and therefore an unprocessed area 52 of length L that is substantially identical to the thickness of the embrittled area 51 is formed in the shape of a triangle where the embrittled area 51 of the fourth layer L1-4 cuts across the embrittled area 51 of the second direction. However, in the preceding second direction embrittling step the embrittled area 51 of the second layer L2-4 of one layer's thickness "h" is formed in advance, and therefore the length L of the unprocessed area 52 is approximately the same as the thickness "h" and is kept within a range that does not interfere with division. Moreover, the embrittled area 51 of the fifth layer L1-5 of the first direction is formed as a preceding embrittled area that does not contain an unprocessed area 52, without intersecting the embrittled area 51 of the second direction.

Then, after rotating the wafer 1 90° by rotating the chuck table 21, finally, as shown in FIG. 8(f), in the second direction embrittling step, with n=1, with the focal point P of the pulsed laser beam to be emitted remaining positioned at a fifth layer L2-5 of the predetermined division line 12 of the second direction an embrittled area 51 of the second direction is formed as the fifth layer L2-5 stacked on top of the fourth layer L2-4. The thickness of the embrittled area 51 of the fifth layer L2-5 thus formed is "h". At this point, the embrittled area 51 of the fifth layer L2-5 is formed so as to intersect the embrittled area 51 of the first direction formed in the preceding first direction embrittling step, and therefore an unprocessed area 52 of length L substantially identical to the thickness of the embrittled area 51 is formed in the shape of a triangle where the embrittled area 51 of the fifth layer L2-5 cuts across the embrittled area 51 of the first direction. However, in the preceding first direction embrittling step the embrittled area 51 of the fifth layer L1-5 of one layer's thickness "h" is formed in advance, and therefore the length L of the unprocessed area 52 is approximately the same as the thickness "h" and is kept within a range that does not interfere with division.

Figure 9:
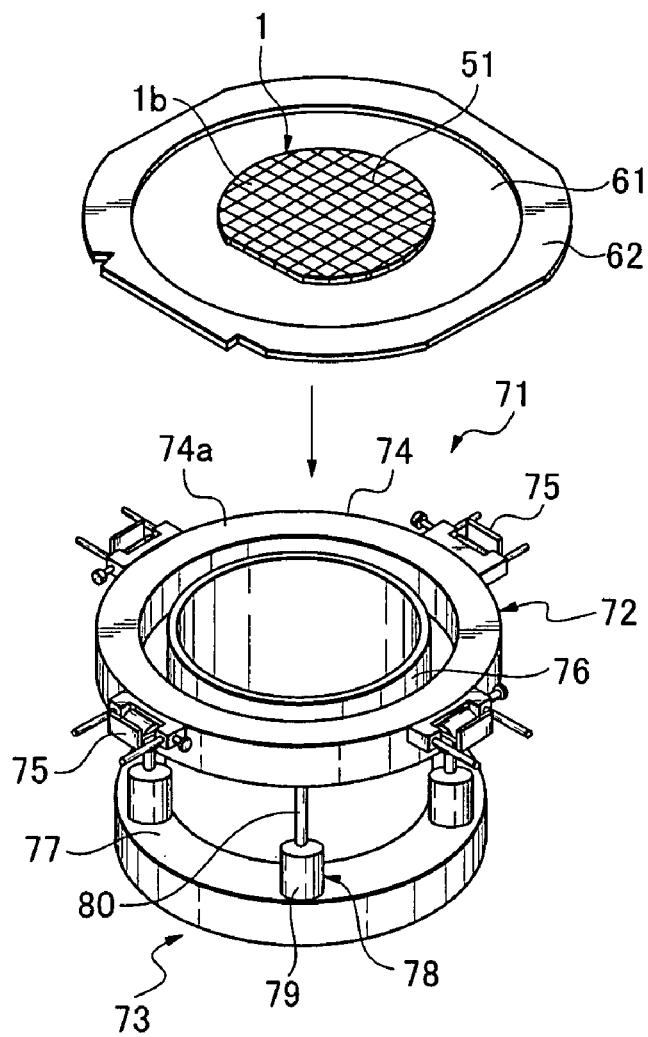
FIG. 9 is a perspective view of a dividing step using a tape expansion device.

After forming the embrittled areas 51 in multiple layers along the predetermined division lines 11, 12 inside the wafer 1 and weakening the wafer 1 thereat by the embrittling steps as described above, expandable protective tape 61 is affixed to the rear surface 1b side of the wafer 1 as shown in FIG. 9. Specifically, a front surface of extensible protective tape 61, attached to an outer peripheral portion of an annular frame 62 so as to cover an interior opening in the annular frame 62, is affixed to the rear surface 1b of the wafer 1. The protective tape 61, for example, may consist of a sheet base material made of polyvinyl chloride (PVC) 70 µm thick the front surface of which is coated with an acrylic resin paste approximately 5 µm thick. It should be noted that if protective tape is affixed to the front surface 1a in the embrittling steps, the protective tape affixed to the front surface 1a side is removed after the protective tape 61 is affixed to the rear surface 1b side.

Figure 10:
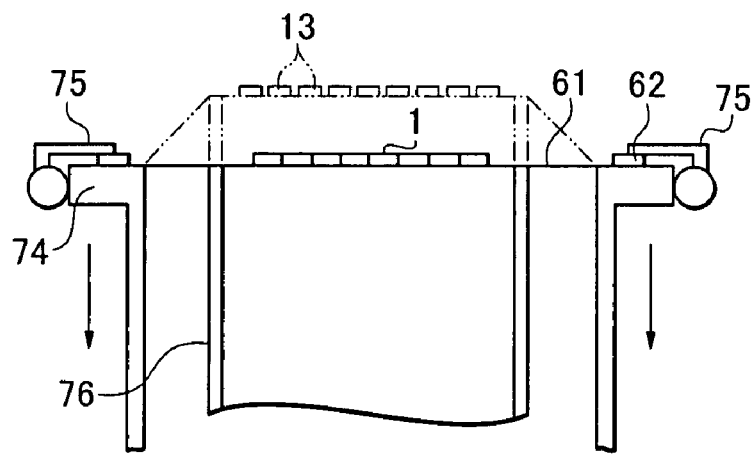
FIG. 10 is a schematic sectional view of a tape expansion operation.

Next, a dividing step is executed, in which, an external force is exerted on the wafer 1 to divide it along the predetermined division lines 11, 12 by forcibly extending the protective tape 61 affixed to the wafer 1. The dividing step is executed using a tape expansion device 71 shown in FIG. 10. The tape expansion device 71 is comprised of a frame holding unit 72 that holds the annular frame 62 and a tape expansion unit 73 that expands the protective tape 61 attached to the frame 62 held by the frame holding unit 72. The frame holding unit 72 is comprised of an annular frame holding member 74 and a plurality of clamp mechanisms 75 disposed on an outer periphery of the annular frame holding member 74. The frame holding member 74 has a placement surface 74a on which the frame 62 is placed, and the clamp mechanisms 75 clamp the frame 62 placed on the placement surface 74a to the frame holding member 74. This type of frame holding unit 72 is supported by the tape expansion unit 73 so as to the reciprocally movable in a vertical direction.

In addition, the tape expansion unit 73 is provided with an expansion drum 76 disposed inside the frame holding member 74. The expansion drum 76 has an inner diameter and outer diameter smaller than the inner diameter of the frame 62 but larger than the outer diameter of the wafer 1. In addition, the expansion drum 76 is provided with a support flange 77 on its bottom end, and moreover, is provided with a support means 78 that supports the frame holding member 74 so that the frame holding member 74 is reciprocally movable in the vertical direction. The supports means 78 is comprised of a plurality of air cylinders 79 disposed atop the support flange 77 with piston rods 80 connecting to a bottom surface of the frame holding member 74. The supports means 78 moves the frame holding member 74 between a reference position, at which the placement surface 74a is at approximately the same height as a top end of the expansion drum 76, and an expansion position, where the placement surface 74a is a predetermined amount below the top end of the expansion drum 76.

Then, the frame 62 supporting through the protective tape 61 the wafer 1 in which the embrittled areas 51 are formed is placed on the placement surface 74a of the frame holding member 74 and is clamped to the frame holding member 74 with the clamp mechanisms 75. At this time, the frame holding member 74 is positioned at the reference position (indicated by the solid lines shown in FIG. 10). Next, the plurality of inner cylinders 79 is operated and the frame holding member 74 is lowered to the expansion position. Because the frame 62 fixedly mounted on the placement surface 74a also descends, it causes the protective tape 61 attached to the frame 62 to receive an external force that contacts the protective tape 61 against the edges of the top end of the expansion drum 76 and expand as shown by the dotted lines in FIG. 10.

At this point, because the wafer 1 to which the protective tape 61 is affixed has been weakened by the formation in multiple layers of the embrittled areas 51 along the predetermined division lines 11, 12, a tensile force as an external force is exerted on the wafer 1 along the predetermined division lines 11, 12 in which the embrittled areas 51 are formed and the wafer 1 breaks along the embrittled areas 51 and is divided into individual devices 13. The individually divided devices 13 are still affixed atop the protective tape 61 and therefore do not disperse, and later may be picked up individually from the protective tape 61.

Thus, as described above, according to the method of the present embodiment, where wafer thickness is T µm, a thickness of embrittled areas 51 formed by irradiation by a laser beam is h µm, "n" is number of layers of embrittled areas to be formed by consecutive execution of the first and second direction embrittling steps, and $T \geq 2h$, the first direction embrittling step that forms embrittled areas of thickness n·h µm in predetermined division lines of the first direction and the second direction embrittling step that forms embrittled areas of thickness n·h µm in predetermined division lines of the second direction so that the length L of the unprocessed area is kept within a range that does not interfere with division are alternately executed. As a result, unprocessed areas 52 of lengths that interfere with division are not remained at where the embrittled areas 51 intersect and the wafer 1 can be divided correctly along the predetermined division lines 11, 12 in accordance with the formed multiple layers of embrittled areas 51. In particular, in the present embodiment, in which embrittled areas 51 produced in the first direction embrittling step are formed as a first layer (bottom layer) L1-1, embrittled areas 51 produced in the second direction embrittling step are formed as a first layer (bottom layer) L2-1 and a second layer L2-2, and embrittlement areas 51 produced in the first direction embrittling step are formed as a second layer L1-2 and a third layer L1-3, by switching the order of precedence of the first direction embrittling step and the second direction embrittling step and executing them alternately, as shown in FIG. 8(f) the unprocessed areas 52 that remain at where the embrittled areas 51 intersect can be disbursed within the predetermined division lines 11 of the first direction and within the predetermined division lines 12 of the second direction, thus equalizing the ease with which the wafer 1 is divided along both sets of predetermined division lines 11, 12, and at the same time reducing the number of times the chuck table 21 is rotated and the embrittlement direction is switched, thereby enabling throughput to be improved.

It should be noted that although in the present embodiment a description is given of an example in which five layers of the embrittled areas 51 are formed in each of the predetermined division lines 11, 12, the present embodiment can be applying without limitation to five layers, and the number of times the first direction embrittling step and the second direction embrittling step are alternately executed may be increased or decreased depending on the number of layers of embrittled areas 51 that are to be formed. For example, in a case in which four layers are to be formed, in the first direction embrittling step, n=1 embrittled areas may be formed as a first layer (bottom layer); in the second direction embrittling step, n=2 embrittled areas formed as a first layer (bottom layer) and as a second layer that is stacked on top of the first layer; in the first direction embrittling step, n=2 embrittled areas formed as a second layer that is stacked on top of the first layer and as a third layer stacked on top of the second layer; in the second direction embrittling step, n=2 embrittled areas formed as a third layer that is stacked on top of the second layer and as a fourth layer stacked on top of the third layer; and finally, in the first direction embrittling step, n=1 embrittled areas formed as a fourth layer (top layer).

Similarly, in the case of three layers, in the first direction embrittling step, n=1 embrittled areas may be formed as a first layer (bottom layer); in the second direction embrittling step, n=2 embrittled areas formed as a first layer (bottom layer) and as a second layer that is stacked on top of the first layer; in the first direction embrittling step, n=2 embrittled areas formed as a second layer that is stacked on top of the first layer and as a third layer stacked on top of the second layer; and finally, in the second direction embrittling step, n=1 embrittled areas formed as a third layer (top layer). In the case of two layers, in the first direction embrittling step, n=1 embrittled areas are formed as a first layer (a bottom layer); in the second direction embrittling step, n=2 embrittled areas formed as a first layer (bottom layer) and as a second layer that is stacked on top of the first layer; and finally, in the first direction embrittling step, n=1 embrittled areas formed as a second layer (top layer).

In addition, although in the present embodiment the number "n", which is a variable that stipulates the number of layers of embrittled areas to be formed by consecutive execution of the first and second direction embrittling steps, is varied between a case in which n=1 and n=2, alternatively, n=1 and the multiple-layer formation of embrittled areas 51 by the first direction embrittling step and the second direction embrittling step may be carried out alternating one layer at a time.

Moreover, although in the present embodiment the length L of the unprocessed area 52 is kept within a range that does not interfere with the division of the wafer 1 if the length L is approximately the same as the thickness "h", alternatively, for example, if the length L of the unprocessed area 52 is within a range that does not interfere with the division of the wafer 1 even when the length L is approximately 2 h, the embrittled areas 51 in each direction may be formed each to a thickness of 2 h. For example, in the first direction embrittling step, n=2 embrittled areas may be formed as a first layer and a second layer; in the second direction embrittling step, n=4 embrittled areas formed as the first through fourth layers; in the first direction embrittling step, n=4 embrittled areas formed as the third through sixth layers; and thereafter, n=4 with the second direction embrittling step and the first direction embrittling step alternately executed, and finally, in the second direction embrittling step, n=2 embrittled areas formed as the layer one layer before the top layer and as the top layer. Alternatively, with n=2, the multiple-layer formation of embrittled areas 51 by the first direction embrittling step and the second direction embrittling step may be carried out alternating two layers at a time.

In addition, although in the present embodiment a description is given of an example of a wafer in which the wafer 1 has a silicon substrate as a base, the present embodiment is not limited to a silicon substrate and is similarly applicable to a variety of substrates, such as a sapphire substrate, a silicon carbide substrate, a lithium tantalite substrate, a glass substrate, a quartz substrate, and so forth. In that case, the length L of the unprocessed area 52 that is within the range that does not interfere with the division of the wafer differs depending on the substrate material.

As many apparently widely different embodiments and variations of the present invention can be made without departing from the spirit and scope thereof, it is to be understood that the invention is not limited to the specific embodiments thereof and described herein, except as defined in the appended claims.

What is claimed is:

1. A method of forming embrittled areas inside a wafer for dividing the wafer that positions a focal point of a laser beam having a wavelength capable of penetrating the wafer having predetermined division lines of a first direction and predetermined division lines of a second direction that intersect the predetermined division lines of the first direction, irradiates inside the wafer at the predetermined division lines of the first direction and the predetermined division lines of the second direction, and moves the wafer and the laser beam relative to each other, forming embrittled areas in multiple layers inside the wafer at the predetermined division lines of the first direction and the predetermined division lines of the second direction, the method comprising:

first direction embrittling by forming embrittled areas in a first direction inside the wafer at the predetermined division lines of the first direction in multiple layers by stacking first direction embrittled areas on a bottom layer one by one; and second direction embrittling by forming embrittled areas inside the wafer at the predetermined division lines of the second direction in multiple layers by stacking second direction embrittled areas on the bottom layer one by one;

wherein the first direction embrittling and the second direction embrittling are alternately executed so that lengths of unprocessed areas remaining at positions where layers of embrittled areas in the first and second directions cross each other are made minimum and kept within a range such that said lengths do not interfere with division of the wafer, wherein when the wafer thickness is T μm, and a thickness of each embrittled area formed by irradiation by the laser beam is h μm, forming a predetermined number of layers of embrittled areas by execution of the first and second direction embrittling, and T≧2h by, executing the first direction embrittling to form a first first direction embrittled area at the bottom layer;

executing the second direction embrittling twice to form first and second second direction embrittled areas at the bottom layer and at a second layer, respectively, the second second direction embrittled area at the second layer being stacked on the first second direction embrittled area at the bottom layer;

executing the first direction embrittling twice to form second and third first direction embrittled areas at the second layer and at a third layer, respectively, the second first direction embrittled area at the second layer being stacked on the first first direction embrittled area at the bottom layer and the third first direction embrittled area at the third layer being stacked on the second first direction embrittled area at the second layer;

thereafter, alternately executing the second direction embrittling twice and the first direction embrittling twice until the first direction embrittling forms a final first direction embrittled area at a top layer, the top layer being equal to the predetermined number of layers; and finally, executing the second direction embrittling to form a final second direction embrittled area at the top layer.

* * * * *